United States Patent [19]

Dougherty

[11] 4,237,210
[45] Dec. 2, 1980

[54] AQUEOUS PHOTORESIST METHOD
[75] Inventor: Robert S. Dougherty, Tustin, Calif.
[73] Assignee: RCA Corporation, New York, N.Y.
[21] Appl. No.: 967,793
[22] Filed: Dec. 8, 1978
[51] Int. Cl.³ .......................... C23F 1/02; G03C 5/00; G03C 5/24
[52] U.S. Cl. ................................ 430/318; 156/659.1; 156/902; 156/904; 430/435; 430/643
[58] Field of Search .......... 96/36.2, 93, 48 R, 48 PD, 96/49, 63, 111, 114.9, 115 R; 156/630, 634, 659, 661, 666, 665, 901, 902, 904, 659.1, 661.1; 29/625; 174/68.5; 427/96; 430/313, 314, 318, 319, 329, 434, 435, 643, 332

[56] References Cited

U.S. PATENT DOCUMENTS

| | | | |
|---|---|---|---|
| 4,061,529 | 12/1977 | Goldman et al. | 156/644 |
| 4,158,566 | 6/1979 | Goldman | 96/115 P |

OTHER PUBLICATIONS

Photoresist Material and Processes by W. S. Deforest, 1975, chapter one, History of Photoresists, pp. 1–18.

*Primary Examiner*—William A. Powell
*Attorney, Agent, or Firm*—Birgit E. Morris; Howard F. VanDenburgh

[57] ABSTRACT

A process of producing a photoresist pattern on a circuit board including applying a casein based photoresist film of a thickness of at least 4.0 micrometers to a circuit board, air drying the film, exposing the dried film to actinic radiation through a photomask and developing the exposed photoresist film with soft water to wash away the unexposed areas of the film, thereby leaving an etch resistant pattern of photoresist on the circuit board.

7 Claims, No Drawings

AQUEOUS PHOTORESIST METHOD

This invention relates to the manufacture of printed circuit boards. More particularly, this invention pertains to an improved process of producing an etch resistant photoresist pattern on the surface of a copperclad substrate using a casein based photoresist solution.

BACKGROUND OF THE INVENTION

Photosensitive etch resistant films based on aqueous solutions of natural products such as fish glue, albumin and casein have been known for a number of years. One such useful photoresist composition comprises water, casein, made by acid precipitation of milk, an alkali metal base to impart a pH of 7.7 or higher which improves the solubility of the natural product in the water, and an ammonium dichromate sensitizer. Goldman and Datta in their U.S. Pat. No. 4,061,529 discloses the addition of sodium borate as the base in a concentration so that the photoresist solution has a final pH of 6.7–7.3, to improve the pot life of the coating composition and the shelf life of coated substrates.

These resists have been employed extensively in the lithographic printing arts and in the manufacture of shadow masks for television monitors. A cleaned metal, e.g. copper, surface or substrate is coated with the aqueous photoresist solution and dried. A mask having a desired pattern is contacted to the resist and exposed to light of an appropriate wavelength which hardens the resist in the exposed areas. The resist film is then washed with water to dissolve the unexposed resist and thereby uncover part of the metal substrate. The now partially coated substrate is then dried and baked for about 5 minutes at a temperature of from about 500°–550° F. (260°–287° C.). This step is required to render the remaining photoresist etch resistant. The partially coated substrate is then etched by spraying with hot ferric chloride solution which etches away the bared metal portions. The residual resist can then be removed by hot alkali solution.

The above process has been universally adopted for television shadow mask production because of its low cost, in that the photoresist, water rinse and caustic wash solutions are very inexpensive as compared to organic based photoresists.

However, this process has certain limitations which prevent its use in other high production manufacture which employ lithographic techniques. In particular, in the manufacture of printed circuit boards, a copper-clad substrate, such as a phenolic impregnated paperboard, is etched to form a pattern of conductors to which various components are soldered. Generally, these printed circuit boards are made by screen printing an etch resistant ink onto the boards and etching the exposed metal areas. However, this method is not able to define line widths of less than about 0.025 inch (0.06 centimeters). With the increasing miniaturization of components on printed circuit boards, the need to define line widths and spacings on the order of 0.015 inch (0.04 centimeters) and smaller has occurred. Photolithographic techniques to define such fine pattern spacings must then be employed if high yields are to be maintained.

The pattern is made by applying a photoresist film over the copper layer, exposing and developing the resist to create a pattern of photoresist and exposed copper. The copper is etched away in the exposed areas and the photoresist is then removed, leaving a patterned copper layer on the board. At present, organic-based photoresists are used because the high temperatures required to cure water-based resists cannot be tolerated by the phenolic impregnated paper substrate.

One attempted method to deal with this high temperature curing problem of the water-based photoresists is disclosed by Goldman in U.S. Ser. No. 877,481, filed Feb. 13, 1978, now U.S. Pat. No. 4,158,566, wherein it is disclosed to use an accelerator with such water-based photoresist compositions. As an accelerator there is disclosed N-methylol acrylamide, which, when added to a casein-based photoresist composition, lowers the curing temperature required to make the photoresist etch resistant to a temperature of about 125°–135° C., and enables such compositions to be employed in printed circuit board manufacture.

It has now surprisingly been found that if certain process parameters are followed in the manufacture of printed circuit boards, that the heretofore used curing or post-baking step of the resist pattern can be eliminated. It was previously believed necessary to cure the developed photoresist to render it etch resistant.

SUMMARY OF THE INVENTION

I have now found that casein based solutions can be used in photolithographic techniques as photoresists in the manufacture of printed circuit boards and made etch resistant without the heretofore used curing or post-baking step if certain process parameters are followed in the techniques employed. The process parameters or method limitations that need to be followed to produce etch resistance in the casein photoresist and eliminate the curing step, include: maintaining the thickness of the dried photoresist film at or above 4.0 micrometers; using a water of low hardness content for developing the surface relief pattern in the photoresist film; and using an etchant having a specific gravity of or above 1.34.

DETAILED DESCRIPTION OF THE INVENTION

The invention includes the method of producing an etch resistant pattern on a circuit board using a casein based solution without the heretofore used curing step, and consists essentially of applying a casein based solution to a circuit board to form a film of a thickness when dried of at least 4.0 micrometers, air drying the applied film on the circuit board to form a photoresist, exposing the dried photoresist film to actinic radiation through a photomask and developing the exposed photoresist film with water of a low hardness content to wash away the unexposed areas of the film and leave a surface pattern of etch resistant photoresist film on the circuit board. The process may also include the further steps of etching the circuit board with a ferric chloride based etchant solution having a specific gravity of at least 1.34 to etch those portions of the board not protected by the etch resistant pattern of photoresist film thereon, and stripping the residual photoresist from the circuit board in a hot alkali solution to leave a patterned copper layer on the circuit board.

The aqueous casein solutions used in the process of this invention comprise casein as the sensitizable protein material, sodium borate as the alkalizing agent for the casein, alkali dichromate photosensitizer for the casein, and water. Optionally, small amounts of a surfactant and a dye may also be added if desired. The casein employed may be any acid precipitated casein and usually comprises from about 4 to about 12 percent by weight of the photoresist composition.

The alkalizing agent is added to solubilize the casein and is added in sufficient amount such that the pH of the final photoresist solution is from about 6.7 to about 7.3. Sodium borate is a preferred alkalizing agent in that it does not degrade the casein. Generally, amounts from about 8 to about 20 percent by weight of the casein are sufficient, but additional amounts may be required to bring the pH to the desired level.

Sodium dichromate is the preferred alkali dichromate photosensitizer, as it reduces dark hardening in the casein photoresist. However, other dichromates, such as ammonium and potassium dichromate, can also be employed. The sensitizer is usually added in amounts from about 2 to about 20 weight percent of the casein present. The amount of water added to the solution is adjusted to regulate the viscosity and the thickness of the resultant photoresist coating.

The above aqueous solutions can be prepared by heating deionized water to about 50° to 60° C. and dissolving the sodium borate, surfactant and/or dye, if used. The casein is then added in a small but steady stream with vigorous agitation until dissolved; usually about 30 to 40 minutes is sufficient. The resultant solution is then cooled to room temperature and filtered. Just prior to use, the dichromate sensitizer is added and the pH is adjusted if required with sodium borate.

The aqueous solutions used in the present method can be applied to the circuit board or substrate by dipping, spin coating, roller coating and the like. The thickness of the coated photoresist film should be at least 4 micrometers when dried, and preferably in the range of from about 4 to about 6 micrometers. Application may be repeated to obtain the desired thickness of the dried coating.

After the photoresist coating has been applied to the substrate, the same is dried, usually employing a source of infrared light. Thereafter, the photoresist is exposed to an ultraviolet light source, such as a carbon-arc, xenon, or a mercury lamp through a photomask, which exposure hardens the coating in the exposed areas. The exposed photoresist is then developed by flushing with water, which removes the unexposed portions of the resist, leaving the desired pattern of etch resistant photoresist film on the circuit board. In the process of this invention, the developing is carried out with "soft" water or water of a low hardness content. The flushing or washing water is preferably of a hardness of between about 5 and 150 mg. of calcium carbonate equivalent per liter.

The process of the invention may be further carried out by etching the exposed portions of the copper on the circuit board with a ferric chloride based etchant solution having a specific gravity of at least 1.34, to etch away those portions of the copper metal not protected by the patterned etch resistant coating. The preferred etchant for use in the method of this invention will have a specific gravity of between about 1.34 and 1.42. Following etching, the remaining photoresist on the substrate may be removed with a warm, dilute basic solution, e.g., aqueous 2 to 10 percent by weight sodium hydroxide at 50° to 80° C., to leave a patterned copper layer on the circuit board.

In order to illustrate the invention and the improved process thereof with greater particularity, the following specific example is included. It is intended to illustrate the invention only and is not intended to limit the same in any way.

EXAMPLE

A circuit board having a copper-clad substrate was pretreated to clean the metal surface thereof by the use of a physical abrasion process. Coincidental therewith, an aqueous based photoresist solution was prepared as set forth above using deionized water and casein as the sensitizable material in an amount of about 10 percent by weight of the resultant resist composition. Additionally added to the solution were sodium borate alkalizing agent in the amount of about 1.3 weight percent, sodium dichromate photosensitizer in the amount of about 0.3 weight percent, rhodamine B dye in the amount of about 0.005 weight percent, and a surfactant in the amount of 0.75 weight percent. This solution was coated onto the copper surface of the circuit board by the curtain-coating technique. The resultant photoresist film was air dried at room temperature to a resulting thickness of between about 5 and 8 micrometers.

The dried photoresist coating was then exposed through a photomask for 30 seconds to a mercury arc lamp (Berkey "Arcor" Circuit Exposer), and thereafter developed with a softened water spray of hardness content of about 8 mg/liter of $CaCO_3$ equivalent at a temperature of about 60° F. Etching of the exposed copper layer was then carried out with a ferric chloride based etchant solution having a specific gravity of approximately 1.34–1.38 at about 120° F. The etchant solution contained dissolved copper in an amount of about 6 oz/gal. and a small amount of HCl. Following etching, the remaining resist coating was stripped with warm, dilute sodium hydroxide, leaving a patterned copper layer on the circuit board.

I claim:

1. A method of producing an etch resistant photoresist pattern on a substrate from a casein-based photoresist solution consisting essentially of the following steps:
    (a) applying a casein-based photoresist solution to a substrate to form a photoresist film of a thickness when dried of at least 4.0 micrometers;
    (b) air drying said photoresist film on said substrate to form a photoresist;
    (c) exposing said dried photoresist film to actinic radiation through a photomask;
    (d) developing said exposed photoresist film with water having a hardness content below 150 mg. calcium carbonate equivalent per liter to wash away the unexposed areas of said film thereby leaving a pattern of photoresist film on said substrate which is etch resistant.

2. The method as set forth in claim 1 including the further step of etching said patterned substrate with a ferric chloride based etchant solution having a specific gravity of at least 1.34 to etch those portions of said substrate not protected by said patterned photoresist film.

3. The method as set forth in claim 2 wherein said etchant solution has a specific gravity of between about 1.34 and about 1.42.

4. The method as set forth in claim 3 including the further step of stripping the residual photoresist film from said substrate in a hot alkali solution.

5. The method as set forth in claim 1 wherein said dried film is of a thickness of between about 4.0 and 6.0 micrometers.

6. The method as set forth in claim 1 wherein the water used for developing said exposed film is of a hardness of between about 5 and 150 mg. calcium carbonate equivalent per liter.

7. The method as set forth in claim 1 wherein said casein based solution includes acid precipitated casein, alkali dichromate photosensitizer for said casein, sodium borate as alkalizing agent, and water.

* * * * *